(12) United States Patent
Van Den Bossche et al.

(10) Patent No.: US 8,221,611 B2
(45) Date of Patent: Jul. 17, 2012

(54) DEVICE SUITABLE FOR ELECTROCHEMICALLY PROCESSING AN OBJECT AS WELL AS A METHOD FOR MANUFACTURING SUCH A DEVICE, A METHOD FOR ELECTROCHEMICALLY PROCESSING AN OBJECT, USING SUCH A DEVICE, AS WELL AS AN OBJECT FORMED BY USING SUCH A METHOD

(75) Inventors: Bart Juul Wilhelmina Van Den Bossche, Halle (BE); Marius Ioan Purcar, Leuven (BE)

(73) Assignee: Elsyca N.V., Zellik (BE)

( * ) Notice: Subject to any disclaimer, the term of this patent is extended or adjusted under 35 U.S.C. 154(b) by 673 days.

(21) Appl. No.: 12/307,812

(22) PCT Filed: Jul. 4, 2007

(86) PCT No.: PCT/IB2007/002844
§ 371 (c)(1),
(2), (4) Date: Jan. 7, 2009

(87) PCT Pub. No.: WO2008/010090
PCT Pub. Date: Jan. 24, 2008

(65) Prior Publication Data
US 2009/0288954 A1    Nov. 26, 2009

(30) Foreign Application Priority Data
Jul. 14, 2006   (NL) .................................... 1032174

(51) Int. Cl.
*B41M 5/20*     (2006.01)
*C25D 17/14*    (2006.01)
*C25D 7/00*     (2006.01)
(52) U.S. Cl. ............. 205/766; 204/225; 205/50; 205/52
(58) Field of Classification Search .................. 204/225; 205/50, 52, 766
See application file for complete search history.

(56) References Cited

U.S. PATENT DOCUMENTS

| | | | |
|---|---|---|---|
| 2,739,935 A | | 3/1956 | Kehl et al. |
| 3,437,578 A | | 4/1969 | Gibbs et al. |
| 4,405,411 A | * | 9/1983 | Inoue et al. ..................... 205/93 |
| 4,828,654 A | * | 5/1989 | Reed ............................... 205/97 |
| 4,855,020 A | * | 8/1989 | Sirbola .......................... 205/137 |
| 5,516,412 A | * | 5/1996 | Andricacos et al. ...... 204/224 R |
| 5,993,637 A | * | 11/1999 | Hisamatsu et al. ........... 205/652 |
| 6,032,356 A | * | 3/2000 | Eldridge et al. ................ 29/843 |
| 6,355,147 B1 | * | 3/2002 | Griffiths et al. ............... 204/242 |

(Continued)

FOREIGN PATENT DOCUMENTS

JP        3-285097        12/1991

(Continued)

*Primary Examiner* — Arlen Soderquist
(74) *Attorney, Agent, or Firm* — Barnes & Thornburg LLP

(57) ABSTRACT

A device which is suitable for electrochemically processing an object comprises at least an electrolyte-containing chamber, means for supporting the object to be processed in the chamber, a counter electrode disposed in the chamber as well as means for applying an electrical potential difference between the object to be processed and the counter electrode. The device furthermore comprises at least one holder and at least one rod-shaped coelectrode supported by the holder, which rod-shaped coelectrode extends towards the object and which in use has a polarity opposite that of the counter electrode.

20 Claims, 14 Drawing Sheets

U.S. PATENT DOCUMENTS

| | | | |
|---|---|---|---|
| 6,391,168 B1* | 5/2002 | Ueno | 204/242 |
| 6,491,808 B2* | 12/2002 | Ichinose et al. | 205/646 |
| 6,669,833 B2* | 12/2003 | Kaja et al. | 205/96 |
| 6,896,784 B2* | 5/2005 | Cheng et al. | 205/81 |
| 7,435,324 B2* | 10/2008 | Ramarajan et al. | 205/118 |
| 7,708,875 B2* | 5/2010 | Ramarajan et al. | 205/147 |
| 7,935,240 B2* | 5/2011 | Singh et al. | 205/83 |
| 2003/0168340 A1* | 9/2003 | Kaja et al. | 205/96 |
| 2006/0042953 A1* | 3/2006 | Ramarajan et al. | 205/125 |
| 2007/0039816 A1* | 2/2007 | Scheller et al. | 204/297.05 |
| 2011/0210005 A1* | 9/2011 | Van Den Bossche et al. | 205/82 |

FOREIGN PATENT DOCUMENTS

WO    WO 2006/027311 A1    3/2006

* cited by examiner

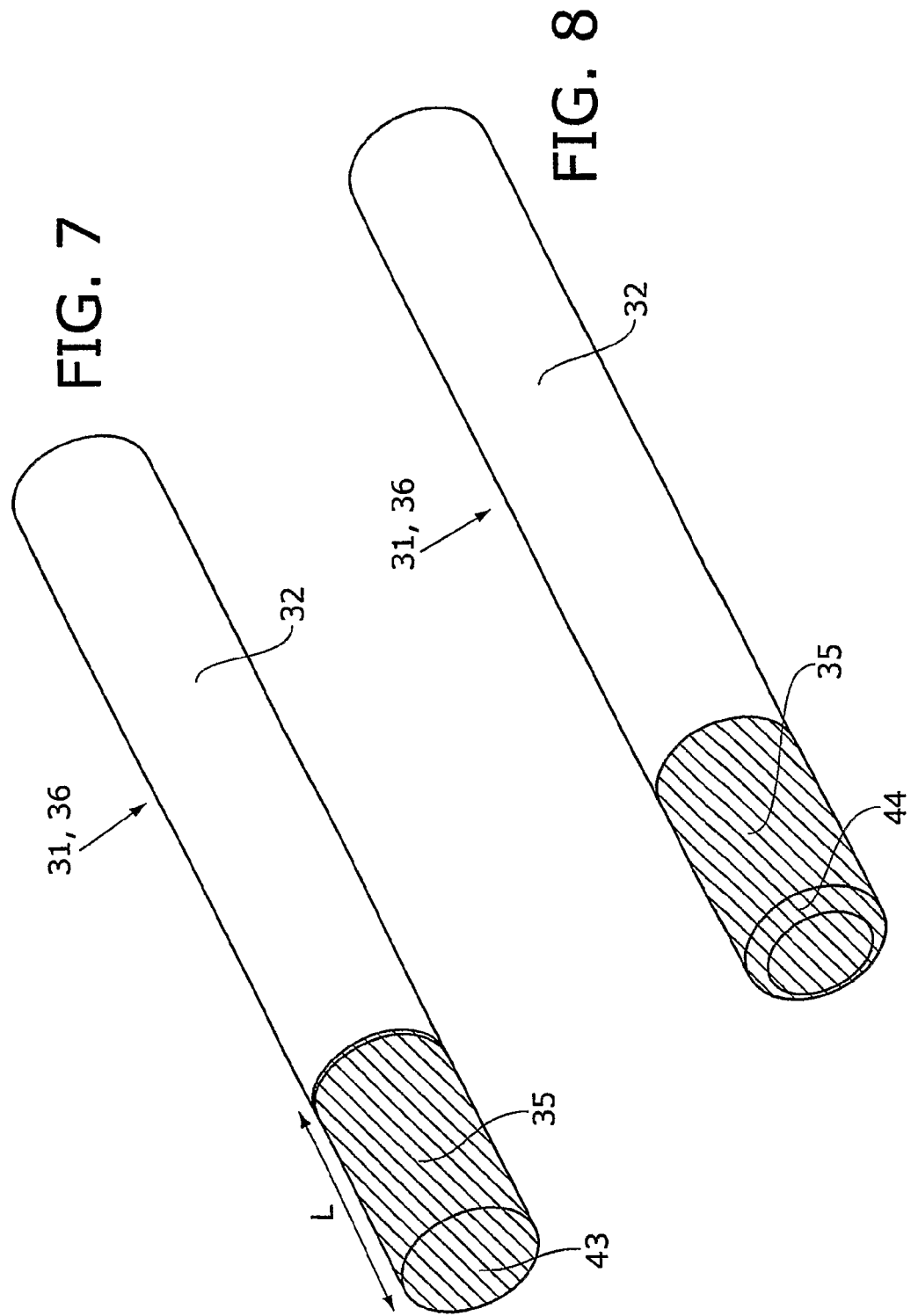

DEVICE SUITABLE FOR ELECTROCHEMICALLY PROCESSING AN OBJECT AS WELL AS A METHOD FOR MANUFACTURING SUCH A DEVICE, A METHOD FOR ELECTROCHEMICALLY PROCESSING AN OBJECT, USING SUCH A DEVICE, AS WELL AS AN OBJECT FORMED BY USING SUCH A METHOD

This is an application claiming priority to and benefit of U.S. National Stage Patent Application No. PCT/NL2007/002844, filed on Jul. 4, 2007 and Dutch Patent Application No. 1032174 filed Jul. 14, 2006 in The Netherlands, the subject matter of each being incorporated by reference herein.

The invention relates to a device suitable for electrochemically processing an object, which device comprises at least an electrolyte-containing chamber, a counter electrode disposed in the chamber, means for applying an electrical potential difference between the object to be processed and the counter electrode as well as means for supporting the object to be processed in the chamber at a substantially constant distance from the counter electrode.

The invention also relates to a method suitable for manufacturing such a device.

With such a device, which is known from WO-A1-2006/027311, a number of rod-shaped counter electrodes are mounted in a holder, and ends of the rod-shaped counter electrodes remote from the holder are positioned opposite the objects to be processed. The object and the counter electrodes are present in a chamber which is filled with an electrolyte, being spaced a constant distance apart. By applying an electrical potential difference between the counter electrodes and the object, the object can either be etched, by which treatment material is removed from the object, or the material can be coated, by which treatment material is applied to the object. During processing, the counter electrodes and the object are stationary, being spaced a constant distance apart.

The term electrochemical processing as used in the present patent application is understood to include: electrochemical etching, electrochemical polishing, galvanising or plating (=applying any type of metallic coating), electrochemical machining (=ECM), anodising, electrophoretic coating, etc., the treatment to be carried out partially depending on the nature of the electrolyte and the current density magnitudes being used.

A good current density distribution over the object is essential in order to realise a correct, precise processing of the object.

It has been found that when a device as known from WO-A12006/027311 is used for processing printed circuit boards, for example, on which a relatively precise pattern of electrical conductors is to be deposited, it is not possible to obtain the required degree of precision, in particular at transitions between surface segments which have a high copper conductor density and segments which have a low copper conductor density, or which do not comprise any copper conductors at all. Edge effects also occur when processing conventional objects characterised by projecting surfaces having a high radius of curvature, as a result of which edge effects the desired processing result cannot be realised.

The object of the present invention is therefore to provide a device by means of which a relatively high processing precision can be obtained in a relatively simple manner.

This object is accomplished with the device according to the Invention in that the device furthermore comprises at least one holder spaced from the object by a substantially constant in use and at least one rod-shaped coelectrode supported by the holder, which rod-shaped coelectrode extends towards, the object and which In use has a polarity opposite that of the counter electrode.

Such a coelectrode is also referred to as "current robber".

The rod-shaped coelectrode, which has the same polarity as the object to be processed, influences the current density distribution over the object and enables a more precise control thereof.

It is noted that a device for electrochemically cutting metals is known from U.S. Pat. No. 2,739,935. The device disclosed therein comprises a plate-shaped sandwich-like electrode provided with a counter electrode, insulating layers disposed on either side of the counter electrode, and coelectrodes disposed on a side of the insulating layers remote from the counter electrode. The metal object is rotated while being cut, whilst the electrode is moved towards the object. Once material has been removed from the object, the electrode is moved further into the object. When a groove is being formed in the metal, the coelectrodes screen the side walls created upon formation of the groove from the action of the counter electrode.

With the device according to the invention, the object remains spaced a substantially constant distance apart from the counter electrode and the rod-shaped coelectrode. The object is stationary relative to the counter electrode and the rod-shaped coelectrode. The counter electrode and/or the rod-shaped coelectrode may also undergo a pulsating movement in a direction transversely to the object, however, with the distance to the object being alternately decreased and increased. This helps to freshen the electrolyte between the counter electrode and the rod-shaped coelectrode on the one hand and the object on the other hand, The average distance between the object and the electrodes remains constant in this case as well, however.

An embodiment of the device according to the Invention is characterised in that the counter electrode comprises at least one rod-shaped counter electrode, with the rod-shaped coelectrode and the rod-shaped counter electrode extending substantially parallel to each other.

The use of a combination of rod-shaped counter electrodes and coelectrodes makes it possible to realise a precise current density distribution over the surface of the object to be processed. The rod-shaped counter electrode is preferably supported by the same holder as the rod-shaped coelectrode, so that a simple structure is obtained.

Another embodiment of the device according to the invention is characterised in that the holder is provided with a plurality of passages extending straight through the holder, in which passages the coelectrode and/or the counter electrode can be removably mounted.

Since the coelectrode and/or the counter electrode can be removably mounted in the various passages, the number and the positions of the counter electrodes and coelectrode can be adapted in a simple manner in order to realise an optimum current density distribution.

The passages in the holder in which no coelectrodes or counter electrodes are mounted, can be sealed by means of a removable seal, if desired, Yet another embodiment of the device according to the invention is characterised in that the passages are provided In a regular pattern in the holder.

In this way a coelectrode or counter electrode can be connected to the holder opposite practically any position on the object.

Yet another embodiment of the device according to the invention is characterised in that the rod-shaped coelectrode and/or the rod-shaped counter electrode comprise(s) an electrically conductive wire coated with an insulating material, which wire extends from the holder In the direction of the objects to be processed, one end of which electrically conductive wire remote from the holder is bare.

Such a wire, which may be pin-shaped or peg-shaped, is relatively easy to manufacture. The distance over which the electrically conductive wire is bare, the distance from the end facing towards the holder to the surface to be processed as well as the diameter of the electrically conductive wire influence the current density distribution over the surface of the object to be processed. The current density distribution over the object can be influenced by adjusting these magnitudes.

Yet another embodiment of the device according to the invention is characterised in that the rod-shaped coelectrode comprises an electrically insulated hollow tube, which extends from a position near the object to be processed to a position on a side of the holder remote from the object to be processed, which rod-shaped coelectrode cooperates with an electrical conductor that is present in the electrolyte on a side of the holder remote from the object to be processed.

The term electrically insulated hollow tube as used herein is understood to mean a hollow tube that is not electrically conductive. By applying a potential to the electrical conductor such that the polarity of the electrical conductor is the same as that of the object and opposite that of the counter electrodes, and electric current will flow through the electrolyte that is present in the chamber and through the electrolyte that is present in the electrically insulated hollow tube, with the tube and the electrolyte present therein forming a virtual electrode. The distance from the end of the tube to the object to be processed, the diameter of the passage in the tube and the potential of the electrical conductor also influence the current density distribution over the surface of the object.

Yet another device according to the invention is characterised in that the rod-shaped counter electrode comprises an electrically insulated hollow tube that extends from a position near the object to be processed to a position on a side of the holder remote from the object to be processed, which rod-shaped counter electrode cooperates with an electrical conductor that is present in the electrolyte on a side of the holder remote from the object to be processed.

By applying a potential to the electrical conductor such that the polarity of the electrical conductor is opposite that of the object, an electric current can flow through the electrolyte that is present In the electrically insulated tube in a direction opposed to the direction in which the electric current flows in a rod-shaped coelectrode comprising an electrically insulated hollow tube.

Yet another embodiment of the device according to the invention is characterised in that the holder is provided with at least one passage, which forms the electrically insulated tube.

In this way it is possible to use electrolyte that is present in the passages in the holder as virtual rod-shaped coelectrodes, as virtual rod-shaped counter electrodes and as mounting openings for rod-shaped coelectrodes or rod-shaped counter electrodes. Furthermore it is possible to seal the passage, In this way the holder with the passages present therein and the rod-shaped coelectrode and/or counter electrodes that may be mounted therein can be readily adapted for processing objects by forming varying patterns thereon.

Yet another embodiment of the device according to the invention is characterised in that the tube is made of an electrically nonconductive material.

From such a material, for example plastic material, a tube can be formed in an inexpensive and simple manner.

Yet another embodiment of the device according to the invention is characterised in that the end of the rod-shaped coelectrode and/or counter electrode remote from the holder is flat or rounded.

By rounding the end of the rod-shaped coelectrode and/or counter electrode, a more uniform current density distribution over said end is obtained, so that the rod will be less liable to wear if it is anodically polarised and less liable to dendritic and/or quickly growing metal depositions if it is cathodically polarised.

Yet another embodiment of the device according to the invention is characterised in that the object to be processed is plate-shaped, wherein the holder extends parallel to the object, whilst the rod-shaped coelectrode extends substantially transversely to the holder.

Such a plate-shaped holder can readily be provided with rod-shaped coelectrodes extending transversely thereto.

Another embodiment of the device according to the Invention is characterised in that the chamber comprises at least two compartments which are separated from each other by the holder, wherein the object to be processed is present in a first compartments, whilst a plate-shaped electrical conductor is present in the second compartment, wherein the holder is at least provided with an electrically insulated hollow tube, which extends from the first compartment to the second compartment.

It is readily possible to apply a potential to the plate-shaped electrical conductor such that the polarity of the electrical conductor is opposite that of the object, as a result of which an electric current will flow through the electrolyte that is present in the electrically insulated tubes. The plate-shaped electrical conductor forms a counter electrodes In that case, and electrolyte present in the electrically insulated tubes functions as virtual rod-shaped counter electrodes. The plate-shaped electrical conductor may also have a polarity opposite that of the counter electrodes, however, in which case electrolyte present in the electrically insulated tube forms the virtual rod-shaped coelectrodes.

Yet another embodiment of the device according to the invention is characterised in that the device comprises a third compartment, which third compartment is provided with an electrical conductor that has a polarity opposite that of the electrical conductor present in the second compartment, wherein the third compartment is separated from the second compartment by a holder, which holder comprises at least one electrically insulated tube that extends from the first compartment, through the second compartment, into the third compartment.

In this embodiment both the rod-shaped coelectrode and the rod-shaped counter electrodes are formed by the tubes and the electrolyte that is present in the electrically Insulated tubes, wherein electric current flows in the electrolyte between the first compartment and the second compartment in a direction opposed to the direction of the electric current in the electrolyte from the third compartment to the first compartment.

Yet another embodiment of the device according to the invention is characterised In that the device comprises an optimising unit for optimising the current density distribution over the object to be processed, wherein positions of the counter electrode and the rod-shaped coelectrode can be adjusted relative to the holder.

The optimising unit is used for determining the positions of the counter electrodes and the rod-shaped coelectrode relative to the holder and thus relative to the object such that an optimum current density distribution over the object to be processed is obtained, which can be realised with a high degree of processing precision.

The invention also relates to a method for manufacturing such a device.

The method according to the Invention is characterised in that, depending on the pattern to be formed on an object by electrochemical processing, at least one counter electrode Is provided, and that subsequently a current density distribution over the object to be processed is determined, after which the current density distribution thus determined is compared to a predetermined desired current density distribution, after which a rod-shaped coelectrode is added, such that the subsequently determined current density distribution corresponds more to the predetermined, desired current density distribution.

By determining the positions of the counter electrode and the rod-shaped coelectrode in such an iterative manner, the desired optimum current density distribution can be realised relatively quickly.

The current density distribution can be improved by increasing the number of rod-shaped coelectrodes and adding at least one rod-shaped counter electrode, and furthermore by varying the diameter, the distance to the object, the length of the stripped end of the individual rod-shaped coelectrodes and counter electrodes.

The invention will now be explained in more detail with reference to the drawings, in which:

FIGS. 7 and 8 are perspective views of rod-shaped elements of the device according to the invention that is shown in FIG. 3;

Like parts are indicated by the same numerals in the figures.

Figure 1:
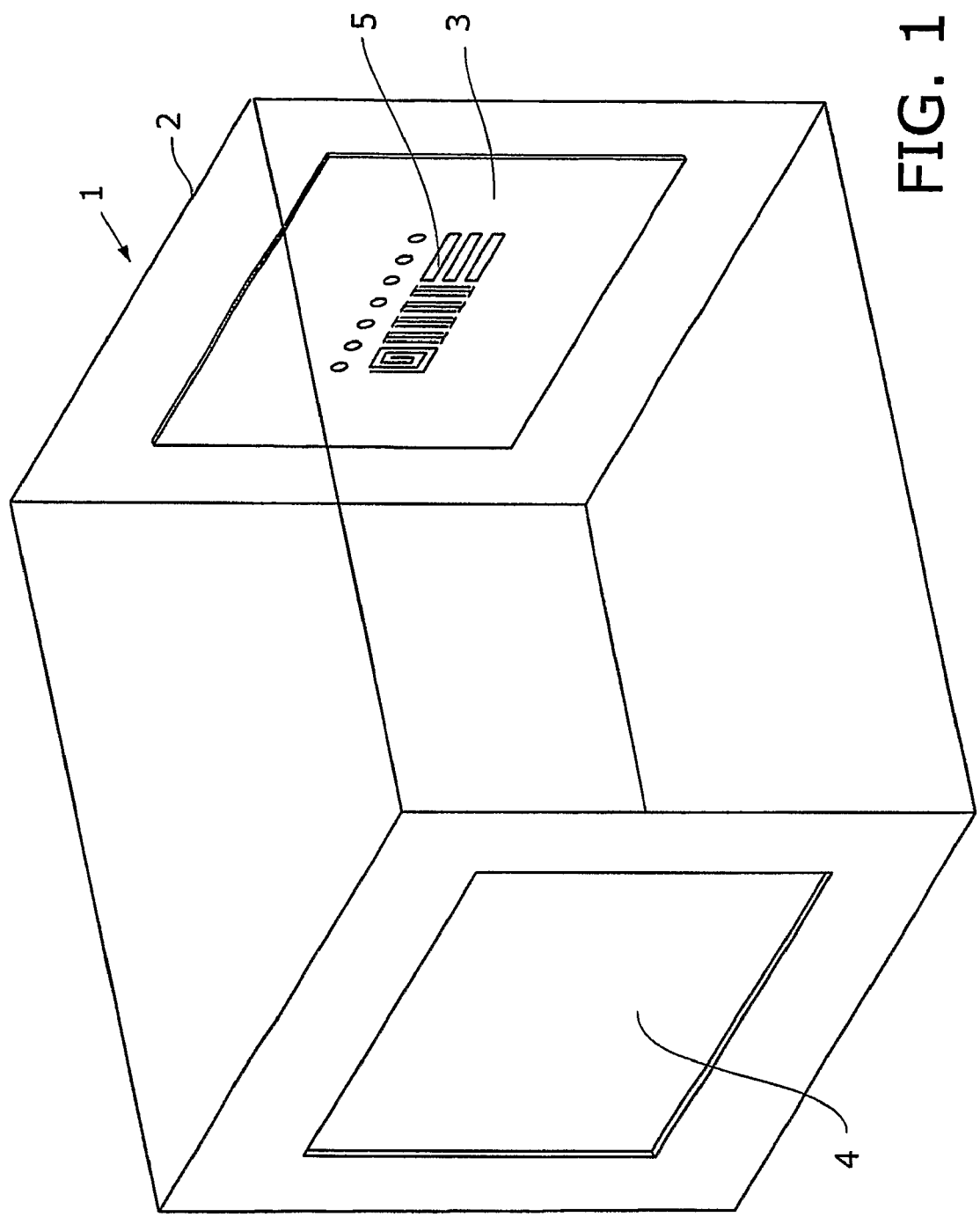
FIG. 1 is a perspective view of a device according to the prior art.

FIG. 1 shows a device 1 according to the prior art, which comprises an electrolyte-filled chamber 2, a plate-shaped object 3 to be processed, which is present in the chamber 2, and a plate-shaped counter electrode 4. Such a plate conventionally comprises an electrically nonconductive carrier plate, a copper layer applied thereto and a pattern 5 formed thereon by means of a photosensitive layer. It will be understood that said pattern 5 is merely shown by way of example and does not represent a conductor pattern to be actually realised on a printed circuit board. The pattern 5 may be identical to or complementary to the pattern to be formed in/on the copper layer.

To process the object 3, an electrical potential difference is applied between the object 3 and the counter electrode 4. As a result, current will flow through the electrolyte that is present between the object 3 and the counter electrode 4. The pattern 5 on the copper layer that is accessible in the photosensitive layer is etched away thereby and thus a pattern corresponding to the pattern 5 is formed in the copper layer. The precision with which the pattern 5 is realised in the copper layer depends to a large extent on the current density distribution over the object 3, It has been found that said current density distribution depends not only on the positions of the object 3 and the counter electrode 4 in the chamber 2 and on the electrical potential difference between the counter electrode 4 and the object 3 and the electrolyte present in the chamber 2, but also on the pattern 5 that is desired. The density, the shape and the level of detail of the pattern 5 to a significant extent determine the current density distribution over the object 3 and thus the precision with which the pattern 5 can be etched or deposited.

Figure 2:
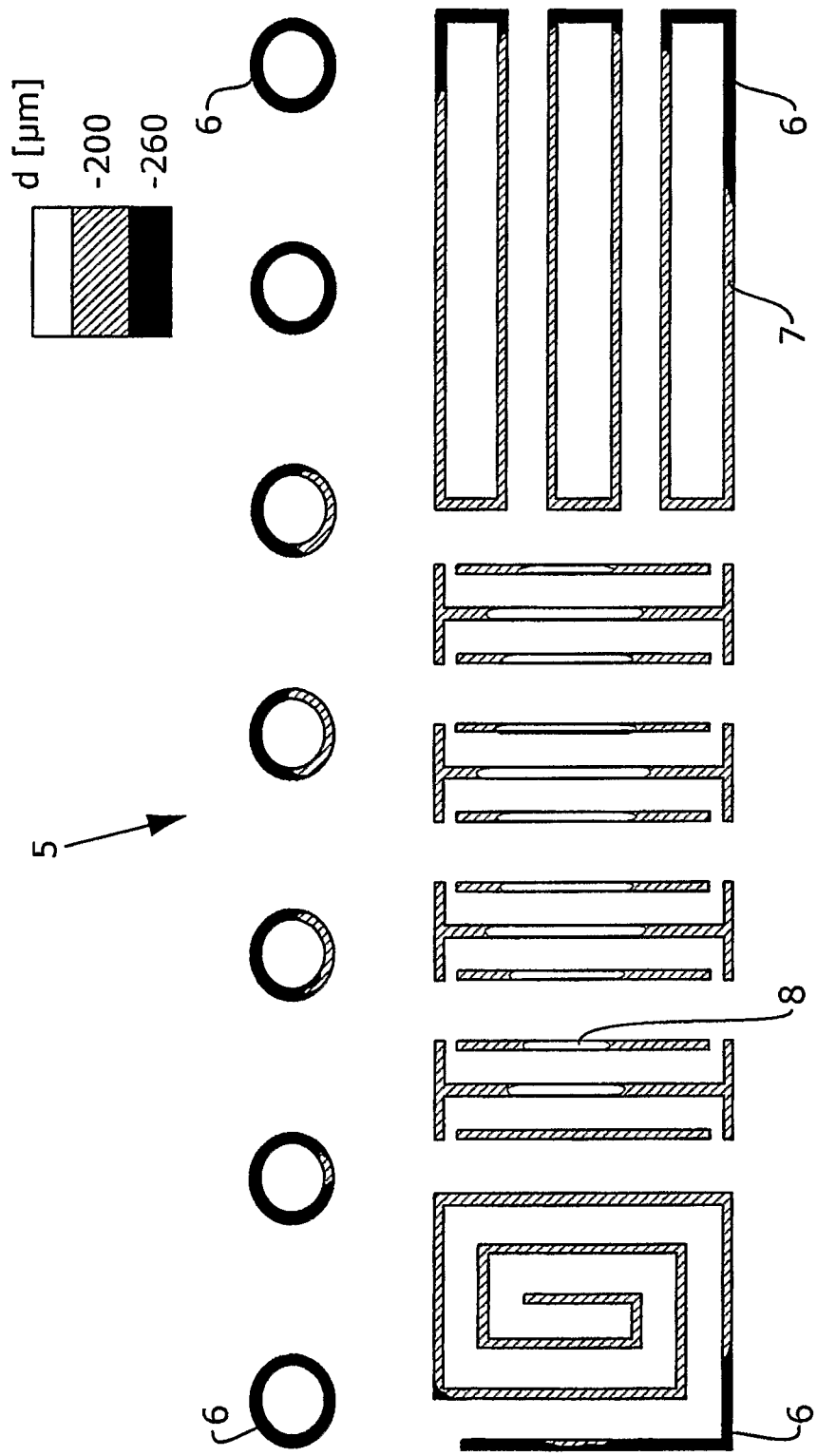
FIG. 2 shows a detail of an object to be processed by means of the device that is shown in FIG. 1.

FIG. 2 is a larger-scale view of the pattern 5 formed in the copper layer, with different hatchings indicating different depths of the pattern 5. As the figure clearly shows, the parts 6 located at the edge of the pattern 5 have been etched deeper than the parts 7, whilst the parts 8 have been etched very shallow. Only a relatively imprecise pattern 5 can be formed on an object by means of such an etching method, which is known per se, in particular in the case of relatively great differences in size between parts of the pattern. The fact is that underetching will occur at the parts 6, and also copper present under the photosensitive layer will be etched away as a result of lateral etching, whilst the copper layer present at the accessible places of the parts 8 has not been etched away completely yet at the end of the process time. This method of etching objects, for example printed circuit boards, is known per se and will not be explained In more detail herein, therefore. Instead of etching the object, during which treatment material may be removed from the object 3, it is also possible to provide the object 3 with material in a comparable manner. To this end, the polarities of the object 3 and the counter electrode 4 are usually reversed. Such a method, also called plating or galvanising, is known per se and will not be explained in more detail herein, therefore. As is the case with etching, however, the problem that occurs when plating or galvanising according to the prior art is that the degree of precision with which the pattern 5 can be formed or deposited on the object 3 is relatively low, because of the occurrence of the aforesaid edge effects.

Figure 3:
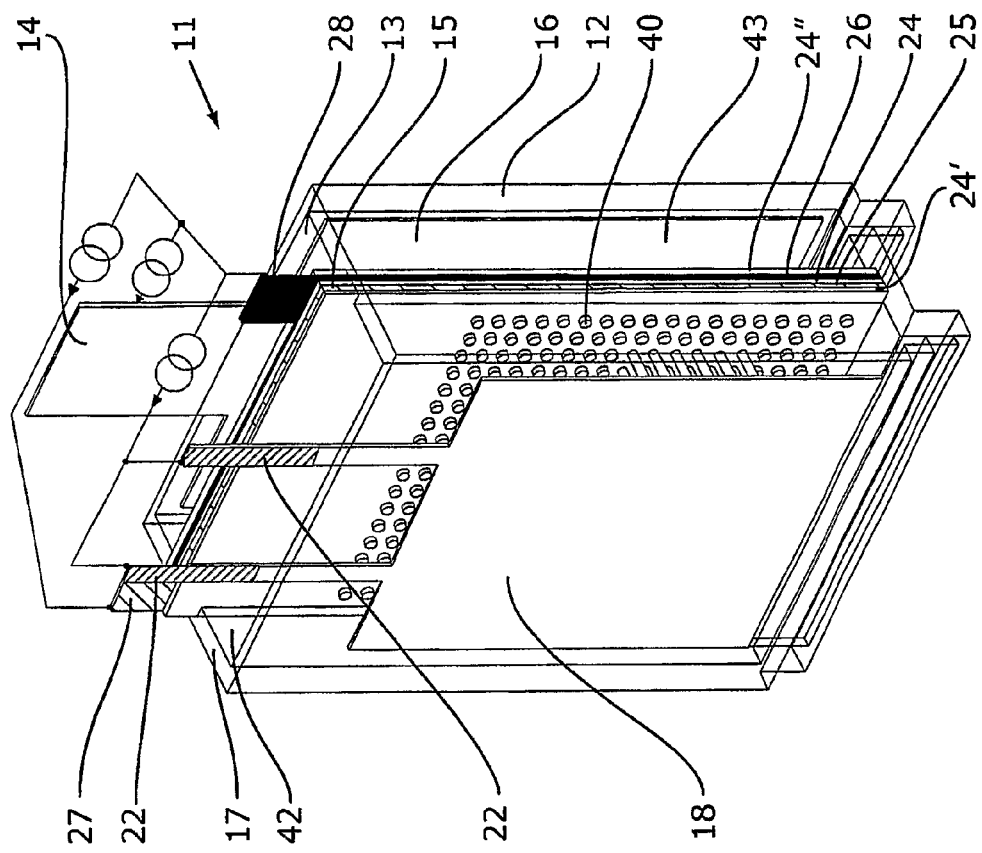
FIG. 3 is a perspective view of a first embodiment of a device according to the invention.

FIG. 3 shows a device 11 according to the invention, which comprises a chamber 12 in which an electrolyte is present. The chamber 12 is conventionally provided with means via which electrolyte can flow into the chamber at the bottom side and flow out of the chamber at the upper side.

Figure 4:
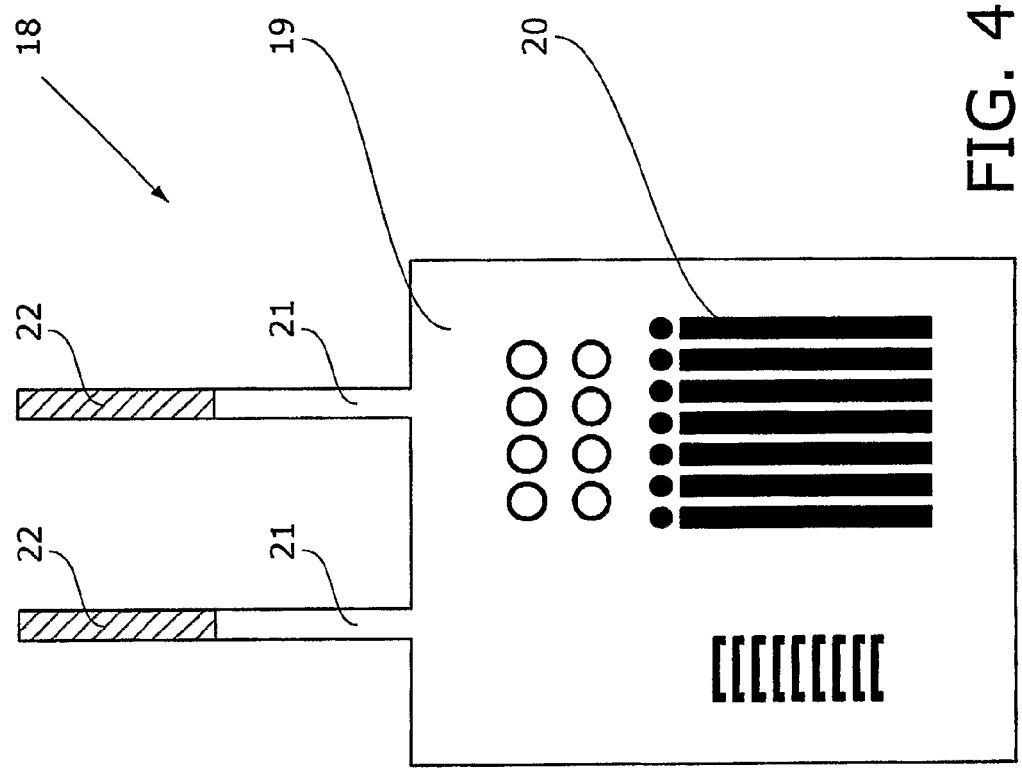
FIG. 4 is a front view of an object to be processed by means of the device that is shown in FIG. 3.
Figure 5:
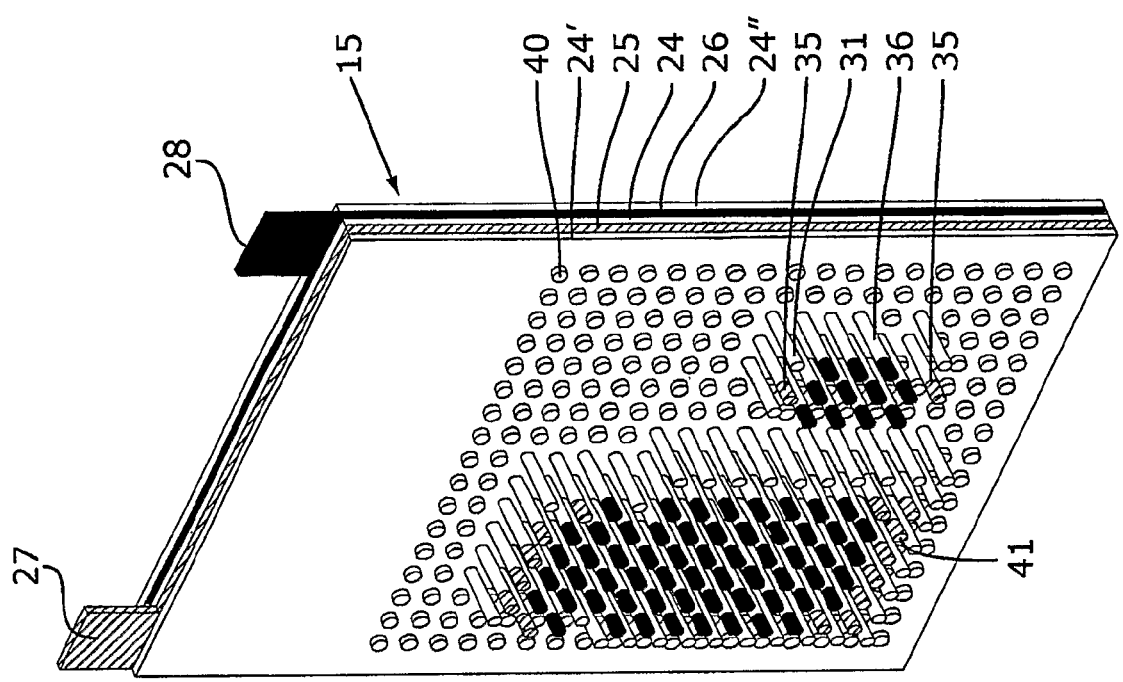
FIG. 5 is a perspective view of a part of the device that is shown in FIG. 3.

A plate-shaped metal coelectrode 14 is provided near a wall 13 of the chamber 12, A holder 15 is provided near the centre of the chamber 12, which holder is positioned parallel to the wall 13 and extends between side walls 16, 17 that extend transversely to the wall 13. A plate-shaped object 18 to be processed is disposed in the chamber 12 on a side of the holder 15 remote from the plate-shaped coelectrode 14. As is shown more clearly in FIG. 4, the plate-shaped object 18 is comprises a plate 19 coated with a copper layer, on which a pattern 20 has been formed by means of a photosensitive layer, which copper layer will be etched away in the exposed zones. The plate may also be completely made of steel or another high-grade material or alloy with a pattern 20 formed In a photosensitive layer thereon, wherein the steel plate may be etched through completely at the location of exposed zones.

The photosensitive layer has been removed from the strips 21, so that electrically conductive parts 22 are exposed. The parts 22 extend above the chamber 12 and are connected to a power source or voltage source (not shown). The plate may also project partially above the electrolyte, in which case a photosensitive free zone will be present for electrical contacting. The device 11 Is provided with means (not shown) that support the object 18 in the chamber 12. Said means may comprise clamps that engage the parts 22.

FIGS. 5 and 6a-c show a perspective view and a detailed, resealed version of the holder 15 of the device 11 that is shown in FIG. 3.

The holder 15 comprises an electrically insulating plate 24 of plastic material, electrically conductive metal plates 25, 26 disposed on either side of the plastic plate 24, and electrically insulating plates 24', 24" disposed on sides of the plates 25,26 remote from the plastic plates 24. The electrically conductive plates 25, 26 are each provided with a contacting strip 27, 28 extending from the chamber 12. Passages 29, 30 extend through the plate 24', the electrically conductive plates 25, 26 and the plastic plate 24, the diameter of which passages 29 is larger than the diameter of the passages 30.

Several rod-shaped elements may be mounted in the passages 30, for example by means of screw thread or a force fit.

The rod-shaped element 31 comprises a metal wire 33 provided with insulating material 32. The insulating material 32 has been stripped from the metal wire at both ends 34, 35, so that the electrically conductive wire 33 is bare at said ends. The end 34 extends through the plate 24', the electrically conductive plate 25, the plate 24 and the electrically conductive plate 26 unto the plastic plate 24", The diameter of the end 34 substantially corresponds to the diameter of the passage 30. An electrically conductive ring 38 is positioned in the passage 29 in the electrically conductive plates 25, whilst a ring 39 of an electrically insulating material Is positioned in the passage 29 in the electrically conductive plate 26, The rod-shaped element 31 is In electrically conductive contact with the electrically conductive plate 25 via the ring 38.

Figure 6A:
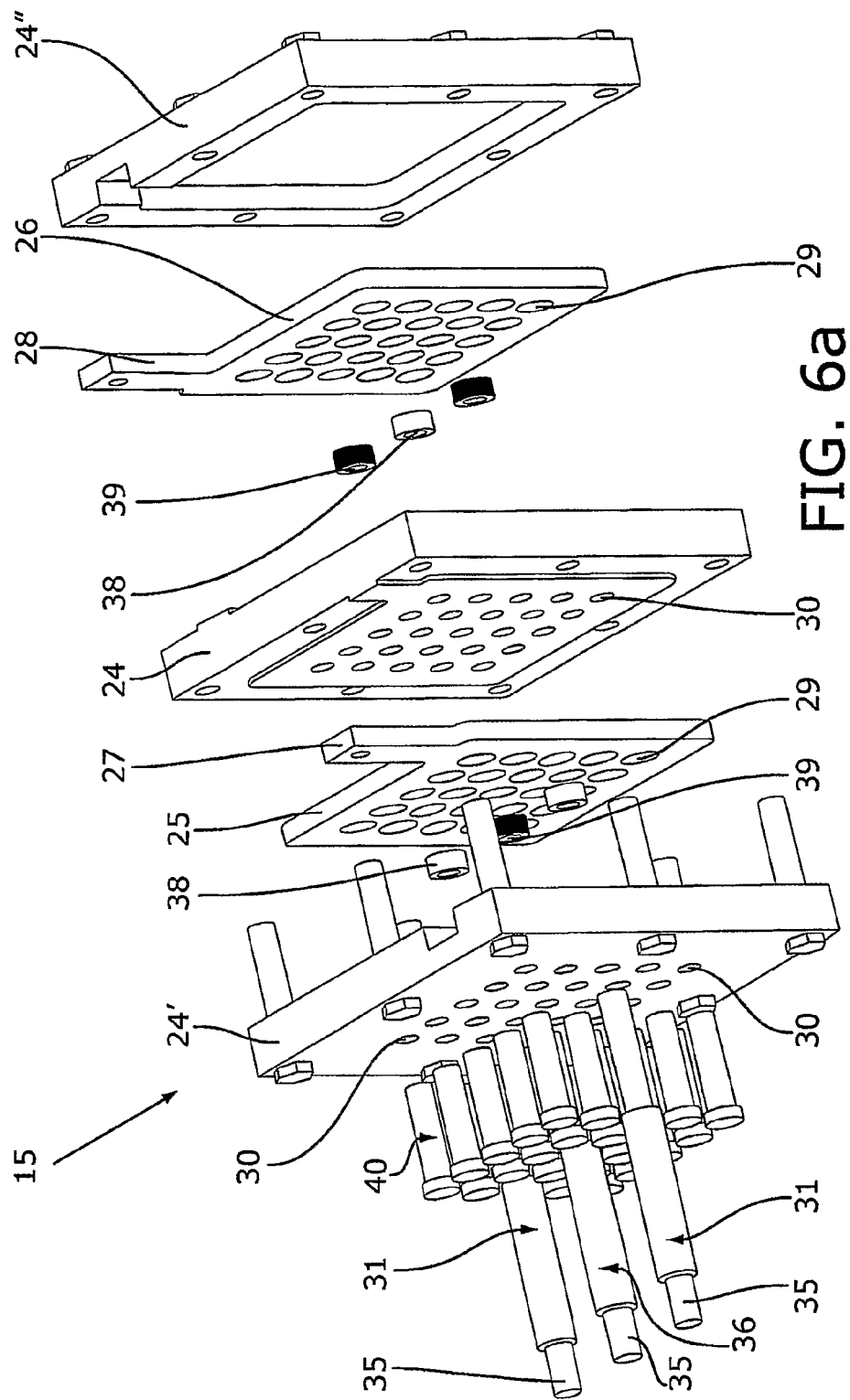
FIGS. 6a-6c show an exploded perspective view, a perspective view and a sectional view, respectively, of a part of the device according to the invention that is shown in FIG. 5.
Figure 6B:
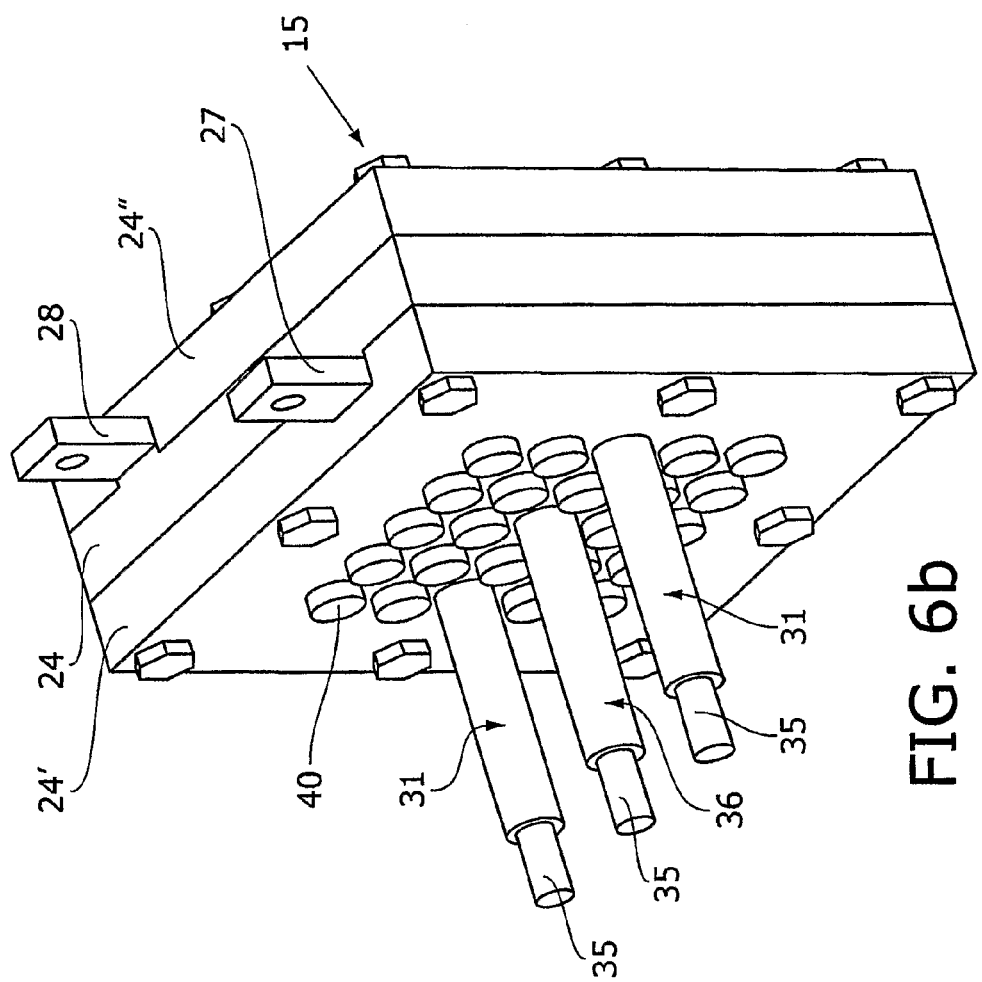
Figure 6C:
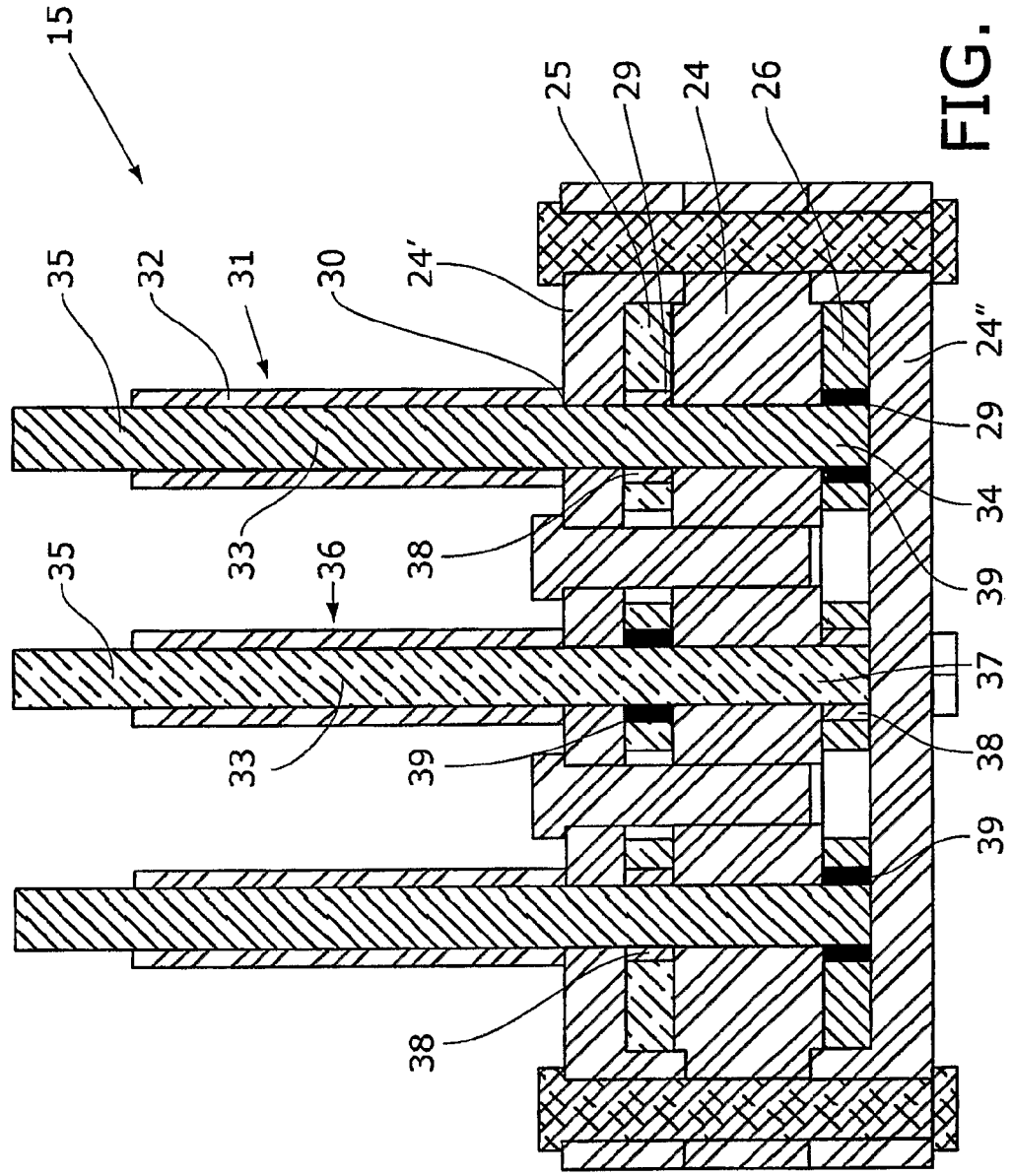

The rod-shaped element 36 that is shown in FIGS. 6a-c is physically identical to the rod-shaped element 31, The end 37 of the rod-shaped element 36 extends unto the plastic plate 24" In a similar manner. An electrically nonconductive ring 39 is now positioned in the passage 29 of the electrically conductive plates 25, whilst an electrically conductive ring 38 is positioned in the passage 29 in the electrically conductive plate 26. The electrically conductive wire 33 of the element 36 is in electrically conductive contact with the electrically conductive plates 26 via the electrically conductive ring 38, As FIG. 5 clearly shows, a number of passages 29, 30 are provided with rod-shaped elements 31 or rod-shaped elements 36. Some of the other passages 29, 30 are sealed by means of sealing elements 40, which are removably connected to the layer 24 of plastic material.

Electrically nonconductive tubes 41 of plastic material are provided in the remaining passages 29, 30, which tubes are connected to the plastic plates 24 with one end. The plastic tubes 41 extend to near the object 18.

As FIG. 3 clearly shows, the holder 15 divides the chamber 12 into two compartments 42, 43. The first compartment 42 contains the object 18 to be processed, whilst the second compartment 43 contains the plate-shaped electrical conductor 14. Electrolyte is present in both compartments 42, 43, and electric current can flow from one compartment to the other compartment through the electrolyte in the tubes 41.

The operation of the device is as follows.

The holder 15 has been provided with a pattern of rod-shaped elements 31, 36, tubes 41 and sealing means 40 in a manner yet to be explained hereinafter. To process the object 18, a potential is applied to the contact element 27 that Is connected to the electrically conductive plate 25, such that the electrically interconnected rod-shaped elements 31 have the same polarity as the object and thus function as rod-shaped coelectrodes 31, whilst the contact element 28 that is connected to the electrically conductive plates 26 is given a potential such that the electrically interconnected rod-shaped elements 36 will have a polarity opposite that of the object and thus form rod-shaped countering electrodes. The electrical conductor 41 may be given a potential such that the electrolyte in the hollow tubes 41 will function as counter electrodes or as coelectrodes. The electrical conductor 14 in the device 11 has the same polarity as the object, with the electrolyte in each tube 41 functioning as a virtual rod-shaped coelectrode. The tubes 41 are complementary to the rod-shaped coelectrodes 31.

The presence of at least one counter electrode is required in order to enable etching of the object 18.

Since a potential difference exists between the counter electrodes 36 and the coelectrode 14, current will flow through the electrolyte in the tubes 41, with the electrolyte In each tube 41 likewise functioning as a rod-shaped coelectrode.

The rod-shaped elements 31 and the electrolyte in the tubes 41 all form rod-shaped coelectrodes by means of which the current density on the object near the ends of the rod-shaped coelectrodes is reduced, resulting in a reduced etching action. The rod-shaped coelectrodes are thus connected to the holder 15 in those places, and without the use of such rod-shaped coelectrodes the etching process would proceed more strongly than desired.

Alternatively It is also possible to give the electrical conductor 14 a polarity opposite that of the object, with the tubes 41 functioning as rod-shaped counter electrodes. In that case the current density is only reduced by the rod-shaped elements 31 acting as coelectrodes.

FIGS. 7 and 8 show two rod-shaped elements 31, 36, with the rod-shaped element 31, 36 that is shown In FIG. 7 having a flat end 43, whilst the rod-shaped element 31, 36 that is shown in FIG. 6 has a rounded end 44, When a rounded end 44 is used, the current density distribution over said end will be more uniform, so that the rod will be less liable to wear if it is anodically polarised and less liable to dendritic and/or quickly growing metal depositions if it is cathodically polarised.

Figure 9:
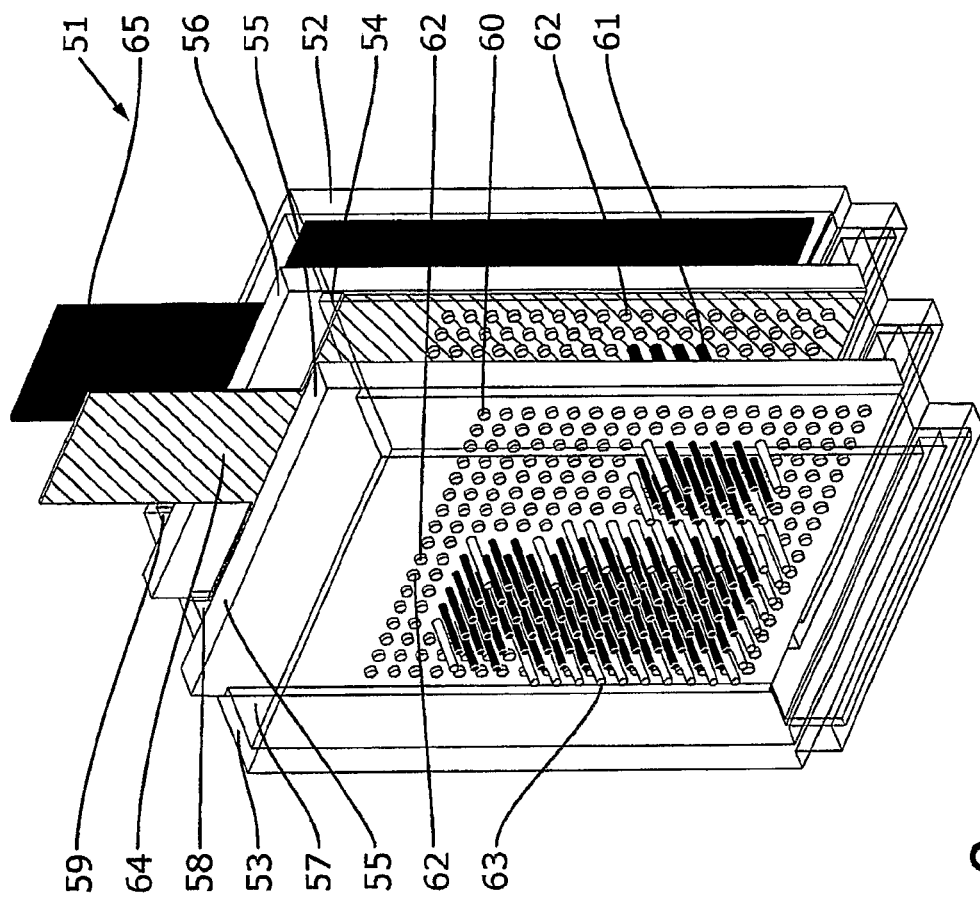
FIG. 9 is a perspective view of a second embodiment of a device according to the invention.
Figure 10:
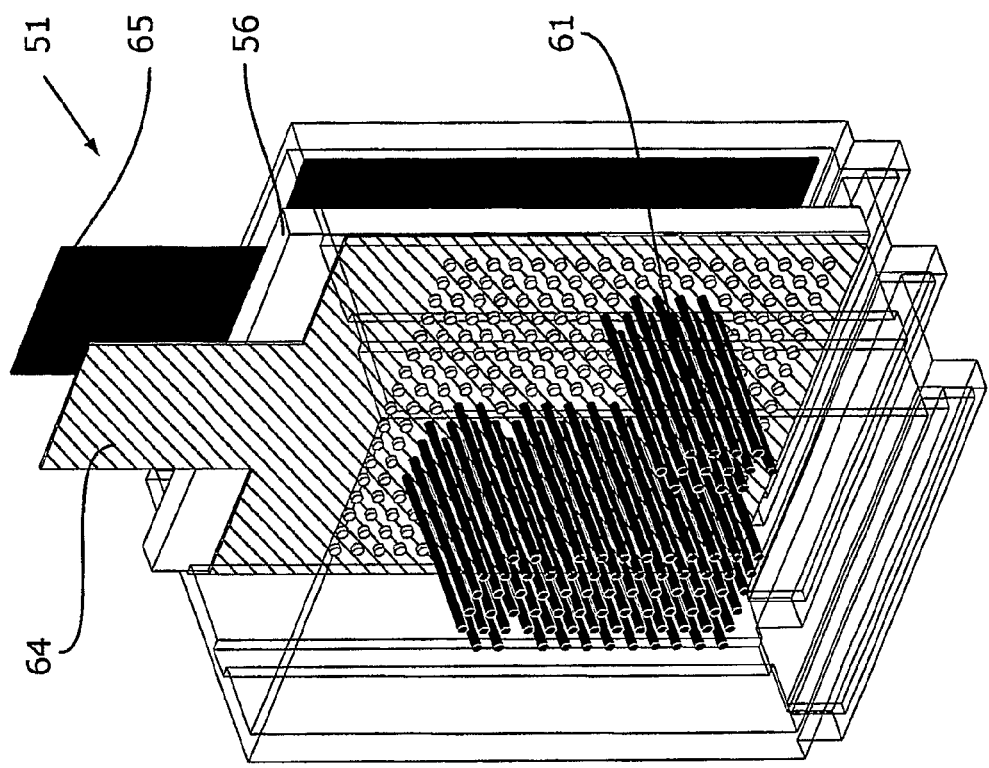
FIG. 10 is a perspective view of a part of the device that is shown in FIG. 9.
Figure 11:
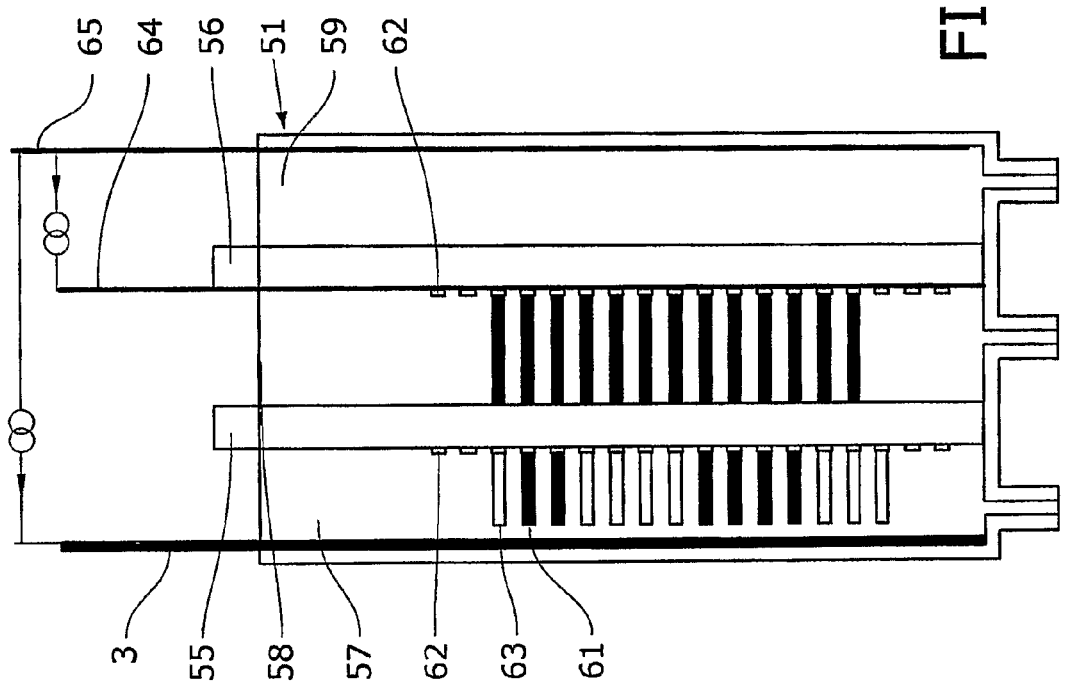
FIG. 11 is a cross-sectional view of the device that is shown in FIG. 9.

The current density distribution over the object to be processed near an end 35 of a rod-shaped element 31, 36 can furthermore be influenced through the selection of the diameter of the electrically conductive wire, the material composition thereof, the length L of the bare end 35 of the electrically conductive wire and the distance to the object to be processed, FIGS. 9-11 show a second embodiment of a device 51 according to the invention, which comprises a chamber 52 that is divided into three compartments 57, 58, 59 by two holders 55, 56 extending between side walls 53, 54. Each holder 55, 56 comprises an electrically nonconductive plate of plastic material, which is provided with passages 60 arranged in a grid. The passages 60 in the holders 55, 56 are mutually aligned, Tubes 61 are provided in a number of passages 60 of the holder 56, which tubes extend from the third compartment 59 through the second compartment 56 and the holder 55 into the first compartment 57. Said tubes are indicated in black in FIGS. 9, 10 and 11, All the passages 60 of the holder 56 that are not provided with tubes 61 are sealed by means of sealing plugs 62 that are removably connected to the holder 56. In this way it is ensured that no direct electrical contact is possible between the electrolyte in the third compartment 59 and the electrolyte in the second compartment 58. Tubes 63 are removably mounted in a number of passages 60 of the holder 55, which tubes 63 extend from the second compartment 58 into the first compartment 57. The tubes 63 and 61 preferably extend the same length from the holder 55. The passages 60 in the holder 55 in which no tubes 61 or 63 are present are sealed by means of sealing plugs 62 that are removably connected to the holder 55. The tubes 61, 53 are made of an electrically nonconductive material, for example a nonconductive plastic.

Disposed in the second compartment is an electrical conductor in the form of an electrically conductive metal plate 64, which is provided with a grid of passages corresponding to the grid in the holders 55, 56. Disposed in the third compartment 59 is an electrical conductor In the form of an electrically conductive plate 65.

To process an object 3 by means of the device 51, the plate-shaped object 3 is positioned in the first compartment 57, opposite ends of the tubes 61, 63, in a manner comparable to that used with the device 11.

The plate 64 is energised by current or voltage sources in such a manner that the plate 64 will have a positive polarity, whilst the plate 65 is given a negative polarity. When the object is etched (positive polarity), the plate 64 and the electrolyte in the tubes 63 will together function as a coelectrode. Current will flow between the second compartment 58 and the first compartment 57 through the electrolyte in the tubes 63. The tubes 63 and the electrolyte present therein function as rod-shaped coelectrodes. The tubes 61 through which current flows between the first compartment 57 and the third compartment 59 via the electrolyte present therein function as rod-shaped counter electrodes. The advantage of using plastic tubes 61, 63 is that metal cannot precipitate on such tubes and that the tubes are not affected, this in contrast to metal coelectrodes.

Figure 12:
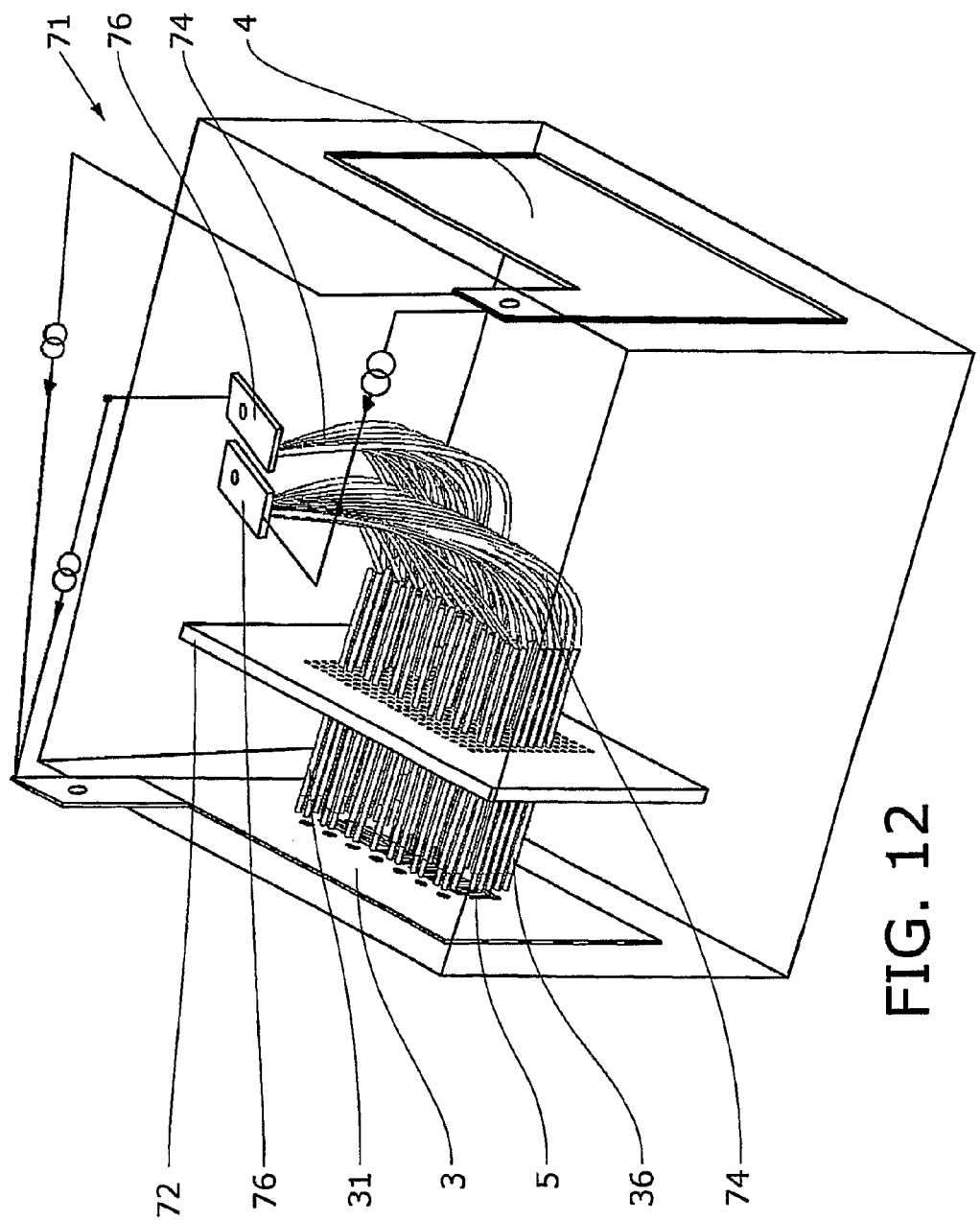
FIG. 12 is a perspective view of a third embodiment of a device according to the invention.
Figure 13:
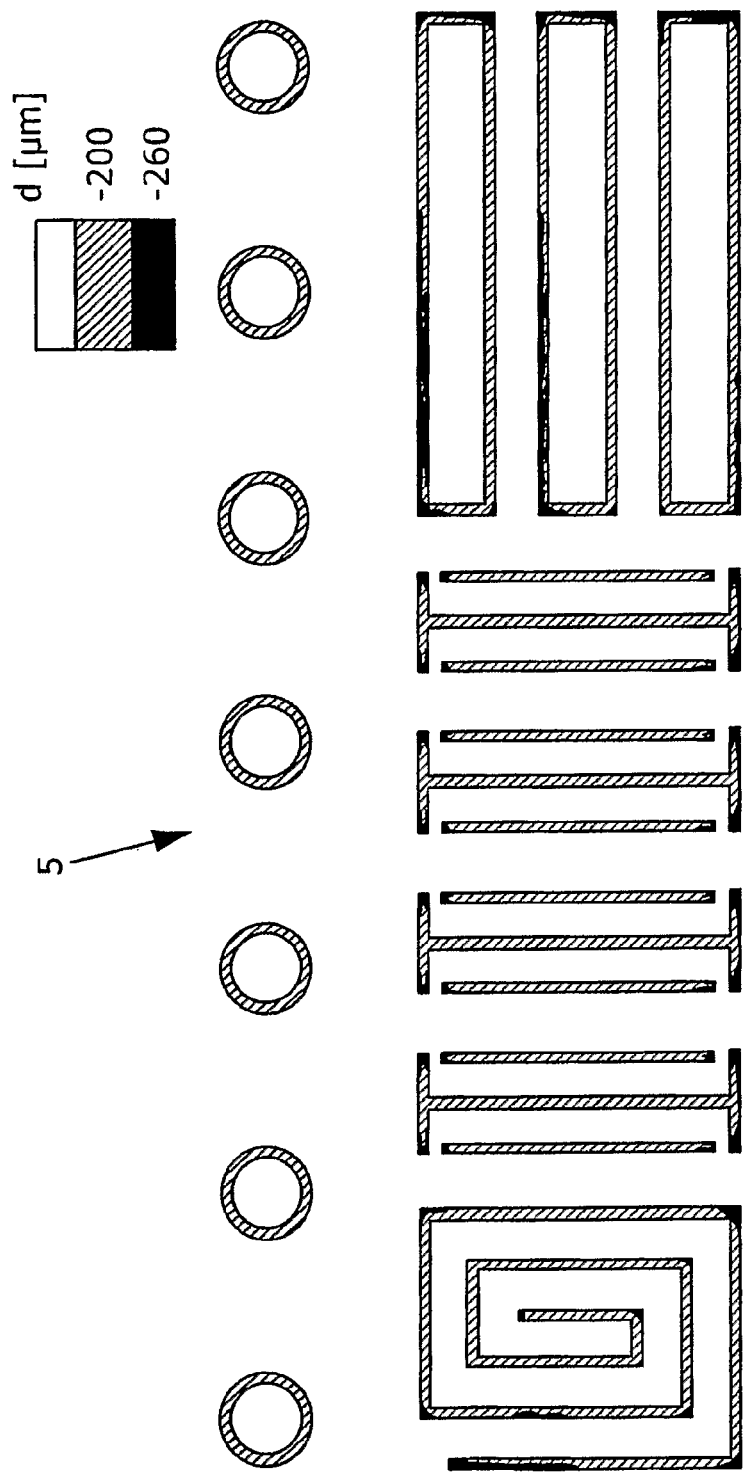
FIG. 13 is a detail view of an object processed by means of a device' according to the invention.

FIG. 12 is a perspective view of a third embodiment of a device 71 according to the Invention, which largely corresponds to the device that Is shown in FIG. 1. The device 71 is different from the device that is shown in FIG. 1 in that the device 71 comprises a plate 72 of plastic material that is disposed opposite the object 3 to be processed in the chamber 2, which plate is provided with a grid of passages 73. Elements 31, 36 are present in a number of passages 73. The other passages 73 are either open or sealed by means of sealing plugs (not shown). The elements 31 are connected to an electrically conductive clamp 75 via flexible, insulated wires 74, whilst the elements 36 are connected to an electrically conductive clamp 76 via flexible, insulated wires 74. The clamps 75, 76 may be given opposite potentials. The other passages 73 are either open or sealed by means of sealing plugs (not shown), The elements 36 are polarised as coelectrodes via the electrically conductive clamp 76, whilst the elements 31 function as counter electrodes via the electrically conductive clamp 75, During operation of the device 71, current will flow through the electrolyte between the ends of the elements 36 and the object 3, and between the ends of the elements 31 and 36. In addition, current will flow through electrolyte between the object 3 and the counter electrode 4 around the plate 72, and through any passages 73 that are open, FIG. 13 shows the pattern 5 as obtained by means of a device 11, 51, 71 according to the invention. As the various hatchings clearly show, the obtained etching depth is significantly more uniform than in the pattern 5 that is shown in FIG. 2.

It will be understood that In order to obtain the desired etching precision or plating precision, it is essential that the rod-shaped coelectrodes and the rod-shaped counter electrodes be correctly positioned. To determine whether the rod-shaped coelectrodes and the rod-shaped counter electrodes are correctly positioned, a matrix structure is preferably defined first over the object to be processed, wherein the object is divided into several sections. The dimension of the sections is determined by the fineness and the variation of the pattern on the object to be treated, or by the fineness and the radius of curvature of projecting parts to be treated on the object. An additional factor that plays a role in the selection of said dimension is the specification of the obtainable uniformity of the deposition or etching rate, Subsequently, the area to be processed within each section is calculated. If the fraction of said so-called active area In relation to the total area of the section exceeds a predetermined minimum value, a counter electrode is positioned in the centre of a section. Then the expected current density distribution over the object to be processed is calculated on the basis of a computer model, and on the basis thereof, via Faraday's law, also the expected etching depth or plating height. In the case of precisely detailed patterns with high etching rate or plating rate specifications, it will be necessary to provide rod-shaped coelectrodes at various positions In the device as well In order to realise an optimum current density distribution over the object to be processed, After the addition of one or more or rod shaped coelectrodes and the possible removal of a number of already defined rod-shaped counter electrodes, the current density distribution Is calculated anew, This iterative process is repeated until a current density distribution and etching rate or plating rate distribution that range within the minimum and maximum specifications or come as close to said values as much as possible are obtained. During this phase, all the rod-shaped coelectrodes and counter electrodes have the same shape and are spaced the same distance from the object. The calculations are carried out on the basis of a computer model in which inter ails geometric configurations of the patterned, the rod-shaped coelectrodes, the rod-shaped counter electrodes, the ohmic voltage drop in the electrolyte, the polarization overvoltage behaviour of all the electrode types that are present, the efficiency of the etching or plating process as a function of the local current density, the current from, for example, rectifiers that drive the rod-shaped counter electrodes and the rod-shaped coelectrodes, respectively, etc are taken into account. After a configuration has been calculated on the basis of the computer model, the device 11, 51 or 71 is manufactured, with the rod-shaped coelectrodes and the rod-shaped counter electrodes being mounted in the holders at predetermined positions. Then an object or a number of objects are processed and the thickness distribution of the etched or deposited layer Is measured and compared with the desired distribution. The local difference between the realised value and the desired value in each section of the matrix is subsequently used for locally Improving the current density through individual adjustment of one or more of the following factors of the coelectrodes or the counter electrodes positioned opposite a section:

the distance to the object
the exposed part of the rod-shaped coelectrode or counter electrode
the diameter, etc.

Then a calculation is carried out again on the basis of the aforesaid computer model, a device is manufactured again and objects are processed again, and the obtained results are compared with the desired results.

Preferably, the position and the number of rod-shaped coelectrodes and counter electrodes in the matrix remain unchanged during this phase, If desired, further adjustments are made on the coelectrodes and the counter electrodes.

After the desired configuration has been determined, a special holder may furthermore be made, which holder will be provided with the desired number of rod-shaped coelectrodes etc, which are fixedly connected to the holder.

The object to be treated by etching, plating, galvanising or polishing may be a flat plate but in principle It may also have any three-dimensional shape that may be desired, whether or not with fully active areas, or only an active pattern. Examples of objects having fully active surfaces include blades for use in turbines and compressors in the aircraft industry, in power plants and in the car industry, Examples of patterned three-dimensional objects include printed circuits on the inner side of plastic housings.

We claim:

1. A device suitable for electrochemically processing an object, which device comprises an electrolyte-containing chamber, a plurality of rod-shaped counter electrodes disposed in the chamber, means for applying an electrical potential difference between the object to be processed and the plurality of rod-shaped counter electrodes as well as means for supporting the object to be processed in the chamber at a substantially constant distance from the plurality of rod-shaped counter electrodes, which device furthermore comprises at least one holder spaced from the object by a substantially constant distance in use and at least one rod-shaped coelectrode supported by the holder, which rod-shaped coelectrode extends towards the object from a same side of the object as the plurality of rod-shaped counter electrodes and which in use has a polarity opposite that of the plurality of counter electrodes.

2. The device according to claim 1, wherein the holder includes a plurality of passages extending straight through the holder, in which passages at least one or more of the at least one rod-shaped coelectrode and the plurality of rod-shaped counter electrodes can be removably mounted.

3. The device according to claim 2, wherein the passages are provided in a regular pattern in the holder.

4. The device according to claim 1, wherein one or more of the at least one rod-shaped coelectrode and the plurality of rod-shaped counter electrodes comprise an electrically conductive wire coated with an insulating material, which wire extends from the holder in a direction of the object to be processed, and one end of the electrically conductive wire remote from the holder is bare.

5. The device according to claim 1, wherein the at least one rod-shaped coelectrode comprises an electrically insulated hollow tube, which tube extends from a position near the object to be processed to a position on a side of the holder remote from the object to be processed, and which at least one rod-shaped coelectrode cooperates with an electrical conductor that is present in the electrolyte on a side of the holder remote from the object to be processed.

6. The device according to claim 5, wherein the holder includes at least one passage which at least one passage forms the electrically insulated tube.

7. The device according to claim 5, wherein the tube is made of an electrically nonconductive material.

8. The device according to claim 1, wherein the plurality of rod-shaped counter electrodes comprise an electrically insulated hollow tube that extends from a position near the object to be processed to a position on a side of the holder remote from the object to be processed, and which plurality of rod-shaped counter electrodes cooperate with an electrical conductor that is present in the electrolyte on a side of the holder remote from the object to be processed.

9. The device according to claim 1, wherein an end of one of the at least one rod-shaped coelectrode and the plurality of rod-shaped counter electrodes remote from the holder is rounded.

10. The device according to any claim 1, wherein the object to be processed is plate-shaped, the holder extends parallel to the object, and the at least one rod-shaped coelectrode extends substantially transversely to the holder.

11. The device according to claim 1, wherein the chamber comprises at least two compartments which are separated from each other by the holder, the object to be processed is present in a first of the at least two compartments and a plate-shaped electrical conductor is present in a second of the at least two compartments, wherein the holder includes with an electrically insulated hollow tube, which tube extends from the first compartment to the second compartment.

12. The device according to claim 11, further comprising a third compartment, which third compartment includes an electrical conductor that has a polarity opposite that of the electrical conductor present in the second compartment, wherein the third compartment is separated from the second compartment by the holder, which holder comprises at least one electrically insulated tube that extends from the first compartment, through the second compartment, and into the third compartment.

13. The device according to claim 1, further comprising an optimising unit for optimising the current density distribution over the object to be processed, wherein positions of the plurality of rod-shaped counter electrodes and the at least one rod-shaped coelectrode are adjustable relative to the holder.

14. The device according to claim 1, wherein the plurality of rod-shaped counter electrodes and the at least one rod-shaped coelectrode are located in the holder, the holder being formed as a matrix such that the plurality of rod-shaped counter electrodes and the at least one rod-shaped coelectrode extend substantially parallel to one another.

15. the device according to claim 1, wherein the at least one rod-shaped coelectrode includes a plurality of rod-shaped coelectrodes.

16. A method for manufacturing a device suitable for electrochemically processing an object the method steps comprising:
providing the device of claim 1 without the at least one rod-shaped coelectrode:
determining a current density distribution over the object;
comparing the determined current density distribution to a predetermined current density distribution:
adding the at least one rod-shaped coelectrode; and
confirming that the determined current density distribution corresponds closer to the predetermined current density distribution.

17. The method according to claim 16, further comprising the steps of computing the current density distribution based upon a computer model, adjusting the number of the plurality of rod-shaped counter electrodes and the at least one rod-shaped coelectrode and their respective positions are until the computed current density distribution corresponds to the predetermined current density distribution, manufacturing the device comprising the at least one rod-shaped coelectrode and the plurality of rod-shaped counter electrodes and by which device the object is processed, adapting the properties of one or both of the plurality of rod-shaped counter electrodes and the at least one rod-shaped coelectrode in the computer model and subsequently in the device, wherein the respective positions of the at least one rod-shaped coelectrode and the plurality of rod-shaped counter electrodes remain unchanged.

18. The method according to claim 16, wherein the determined current density distribution is improved by increasing the number of the at least one rod-shaped coelectrode.

19. The method according to claim 16, wherein the determined current density distribution is improved by adding at least one additional rod-shaped counter electrode to the plurality of rod-shaped counter electrodes.

20. The method according to claim 16, further comprising the steps of placing the plurality of rod-shaped counter electrodes and the at least one rod-shaped coelectrode opposite the object, and setting a polarity opposite to that of the object to the plurality of rod-shaped counter electrodes, setting a polarity identical to that of the object to the at least one rod-shaped coelectrode.

* * * * *